US012559859B2

(12) United States Patent
Li et al.

(10) Patent No.: US 12,559,859 B2
(45) Date of Patent: Feb. 24, 2026

(54) MOLYBDENUM PENTACHLORIDE CONDITIONING AND CRYSTALLINE PHASE MANIPULATION

(71) Applicant: L'Air Liquide, Societe Anonyme pour l'Etude et l'Exploitation des Procedes Georges Claude, Paris (FR)

(72) Inventors: Feng Li, Branchburg, NJ (US); Yumin Liu, Fremont, CA (US); Sameh Helmy, Fremont, CA (US); Peng Zhang, Branchburg, NJ (US); Jean-Marc Girard, Paris (FR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 286 days.

(21) Appl. No.: 18/134,494

(22) Filed: Apr. 13, 2023

(65) Prior Publication Data

US 2024/0344235 A1     Oct. 17, 2024

(51) Int. Cl.
| | |
|---|---|
| *C30B 29/12* | (2006.01) |
| *C30B 23/00* | (2006.01) |
| *C30B 35/00* | (2006.01) |

(52) U.S. Cl.
CPC ............ *C30B 23/002* (2013.01); *C30B 29/12* (2013.01); *C30B 35/007* (2013.01)

(58) Field of Classification Search
CPC ..... C30B 23/002; C30B 29/12; C30B 35/007; C23C 16/08; C01G 41/04; C01G 39/04
See application file for complete search history.

(56) References Cited

U.S. PATENT DOCUMENTS

| | | | |
|---|---|---|---|
| 7,641,886 | B2 | 1/2010 | Tenne et al. |
| 9,230,815 | B2 | 1/2016 | Fu et al. |
| 9,595,470 | B2 | 3/2017 | Bamnolker et al. |
| 10,510,590 | B2 | 12/2019 | Thombare et al. |
| 10,710,896 | B2 * | 7/2020 | Li .................. C30B 35/002 |
| 10,899,630 | B2 * | 1/2021 | Li .................. C01G 41/04 |

(Continued)

FOREIGN PATENT DOCUMENTS

| | | |
|---|---|---|
| CN | 110016653 | 7/2019 |
| JP | 2016 098406 | 5/2016 |
| WO | WO 2017 130745 | 8/2017 |

OTHER PUBLICATIONS

Beck, J. et al., Three new polymorphic forms of molybdenum pentachloride, Acta Cryst. (1997) B53, 895-903.

(Continued)

*Primary Examiner* — Robert M Kunemund
(74) *Attorney, Agent, or Firm* — Yan Jiang

(57)     ABSTRACT

A method of conditioning $MoCl_5$ comprises heating a container of $MoCl_5$ to a temperature ranging from approximately 140° C. to 190° C. for a period ranging from approximately 2 hours to approximately 100 hours to produce a $MoCl_5$-containing composition comprising approximately 10% weight to approximately 60% weight of Phase 1 $MoCl_5$ and 90% weight to approximately 40% weight of Phase 2 $MoCl_5$ as determined by X-ray diffraction. This $MoCl_5$-containing composition is expected to be more thermally stable and provides stable vapor supply.

18 Claims, 3 Drawing Sheets

(56) References Cited

U.S. PATENT DOCUMENTS

| | | | |
|---|---|---|---|
| 2003/0190424 A1 | 10/2003 | Sneh | |
| 2009/0181168 A1 | 7/2009 | Chaubey et al. | |
| 2017/0335450 A1 | 11/2017 | Collins et al. | |
| 2018/0286668 A1 | 10/2018 | Baum et al. | |
| 2019/0031526 A1 | 1/2019 | Takahashi et al. | |
| 2020/0131628 A1 | 4/2020 | Baum et al. | |
| 2021/0020438 A1 | 1/2021 | Byun et al. | |
| 2021/0114894 A1* | 4/2021 | Li | C01G 41/04 |

OTHER PUBLICATIONS

Cotton, F.A. et al., Tungsten pentachloride, Acta Cryst. (1978) B34, 2833-2834.

Ewens, R.V.G. et al., The structures of molybdenum pentachloride and tungsten hexachloride, Trans. Faraday Soc. 1938, 34, 1358-1362.

Hiltunen, I. et al., Nitrides of titanium, niobium, tantalum and molybdenum grown as thin films by the atomic layer epitaxy method, Thin Solid Films, 166 (1988) 149-154.

Johnson, A.W.S. et al., The structure of molybdenum pentachloride-graphite by single-crystal electron and x-ray diffraction, Acta Cryst. (1967) B34, 770-779.

Juppo, M. et al., Deposition of molybdenum thin films by an alternate supply of $MoCl_5$ and Zn, J. Vac. Sci. Technol. A 16(5), Sep./Oct. 1998, 2845-2850.

Juppo, M. et al., Use of 1,1-dimethylhydrazine in the atomic layer deposition of transition metal nitride thin films, Journal of The Electrochemical Society, 147 (9) 3377-3381 (2000).

Okamoto, H., Cl—W, Journal of Phase Equilibria and Diffusion, vol. 31, No. 4, 2010, 402-403.

Porter, D.A. et al., Phase transformations in metals and alloys, Chapman & Hall, 1992, 172.

Sands, D.E. et al., The crystal structure of $MoCl_5$, Acta Cryst. (1959), 12, 723-726.

Wimmer, D.S. et al., $Li_2Ba_4Al_2Ta_2N_8O$, the first barium nitridoalumotantalate with BCT-zeolite type structure, Chem. Eur. J. 2023, 20, e202202448 (1-11).

Zalkin, A. et al., The crystal structure of $NbCl_5$, Acta Cryst. (1958) 11, 615-619.

International Search Report and Written Opinion for corresponding PCT/US2024/024221, Jul. 2, 2024.

* cited by examiner

Simulated MoCl$_5$-Ph1 PXRD 2 theta 12.317, 10216

H, k, l = 2, 2, 0

Wavelength: 1.54056

MOLYBDENUM PENTACHLORIDE CONDITIONING AND CRYSTALLINE PHASE MANIPULATION

TECHNICAL FIELD

The present invention relates to conditioning of molybdenum pentachloride to form specific crystal phase morphologies are disclosed. The specific crystal phase morphologies permit stable vapor pressures over extended periods of time during vapor deposition processes.

BACKGROUND

Semiconductor industry has been using molybdenum oxychloride including molybdenum oxytetrachloride ($MoOCl_4$) and molybdenum dichloride dioxide ($MoO_2Cl_2$) for high throughput Mo containing film deposition on a variety of substrates. A couple of examples include US 2020/0131628 A1 to Entegris that claims the process for depositing Mo-containing film on substrates including TiN, TaN, AlN, $Al_2O_3$, $ZrO_2$, $HfO_2$, $SiO_2$, SiN, $La_2O_3$, $RuO_2$, $IrO_2$, $Nb_2O_5$, $Y_2O_3$, etc. using $MoO_2Cl_2$ vapor and US 2018/0286668 A1 to Entegris that discloses a method of depositing Mo-containing materials using $MoOCl_4$ vapor by CVD, in which deposition using $MoOCl_4$ can proceed at higher rates than using $MoCl_5$ vapor, and achieve low resistivity with relatively low (but not free) oxygen content.

$MoCl_5$ has attracted interests as CVD or ALD materials used to deposit W/Mo-containing films, such as W/Mo metal; $W/MoSi_2$; $W/MoX_2$, in which X is S, Se, or Te; W-doped amorphous carbon, $WO_3$, etc., see, e.g., U.S. Pat. Nos. 9,595,470, 9,230,815, and 7,641,886 and US 2003/0190424. A unique advantage $MoCl_5$ possesses is its oxygen free nature in comparison to its oxyhalide analogs. The use of $MoCl_5$ vapor offers the benefits of extremely low oxygen content in the film and thus obtaining a lower resistivity.

In Thin Solid Films, 1988, 166, 149, L. Hiltunen et al. discloses the processes of depositing $Mo_xN$ using $MoCl_5$ as a precursor. A similar application was disclosed in J. Electrochem. Soc. 2000, 147, 3377 by Juppo et al. The same group also discloses the deposition of Mo metal films using $MoCl_5$ in J. Vac. Sci. Technol. 1998, A16, 2845.

U.S. Pat. No. 10,510,590 B2 discloses processes of Mo-containing layer deposition, which yields low resistivity films, on the W-containing layer, and B, Si, or Ge embedded Mo-containing layer by using $MoCl_5$ as one of the precursors.

Ewens et al. ("The structures of molybdenum pentachloride and tungsten hexachloride", Trans. Faraday Soc. 1938, 34, 1358.) discloses that $MoCl_5$ in the vapor phase demonstrated a trigonal bipyramid structure.

A need remains to supply a stable and reproducible flux of $MoCl_5$ vapors to a vapor deposition process chamber over extended time.

SUMMARY

Disclosed is a method of conditioning $MoCl_5$, the method comprising the step of heating a container of $MoCl_5$ to a temperature ranging from approximately 140° C. to 190° C. (lower than $WCl_5$) for a time period ranging from approximately 2 hours to approximately 100 hours to produce a $MoCl_5$-containing composition comprising approximately 10% weight to approximately 60% weight of Phase 1 (different from $WCl_5$) $MoCl_5$ and 90% weight to approximately 40% weight of Phase 2 $MoCl_5$ as determined by X-ray diffraction. The disclosed method comprises the following one or more features:

the container being selected to be non-reactive to $MoCl_5$;

the container being glass or glass-lined;

the container being stainless steel;

the container being glass, Teflon, or coated stainless steel;

the period ranging from approximately 24 hours to approximately 72 hours;

the period ranging from approximately 36 hours to approximately 48 hours;

the temperature ranging from approximately 150° C. to 180° C.;

the temperature ranging from approximately 160° C. to 170° C.;

the $MoCl_5$-containing composition comprising approximately 10% weight to approximately 60% weight of Phase 1 $MoCl_5$ and 90% weight to approximately 40% weight of Phase 2 $MoCl_5$;

the $MoCl_5$-containing composition comprising approximately 20% weight to approximately 50% weight of Phase 1 $MoCl_5$ and 80% weight to approximately 50% weight of Phase 2 $MoCl_5$;

the $MoCl_5$-containing composition comprising approximately 30% weight to approximately 55% weight of Phase 1 $MoCl_5$ and 70% weight to approximately 45% weight of Phase 2 $MoCl_5$;

the $MoCl_5$-containing composition comprising approximately 40% weight to approximately 50% weight of Phase 1 $MoCl_5$ and 60% weight to approximately 50% weight of Phase 2 $MoCl_5$;

the $MoCl_5$-containing composition being thermally stable; and the $MoCl_5$-containing composition providing stable vapor supply.

Also disclosed is a $MoCl_5$-containing composition conditioned by the disclosed method, having approximately 10% weight to approximately 60% weight of Phase 1 $MoCl_5$ and 90% weight to approximately 40% weight of Phase 2 $MoCl_5$. The disclosed $MoCl_5$-containing composition comprises the following one or more features:

having approximately 20% weight to approximately 50% weight of Phase 1 $MoCl_5$ and 80% weight to approximately 50% weight of Phase 2 $MoCl_5$;

having approximately 30% weight to approximately 55% weight of Phase 1 $MoCl_5$ and 70% weight to approximately 45% weight of Phase 2 $MoCl_5$;

having approximately 40% weight to approximately 50% weight of Phase 1 $MoCl_5$ and 60% weight to approximately 50% weight of Phase 2 $MoCl_5$;

being thermally stable; and providing stable vapor supply.

Notation and Nomenclature

Certain abbreviations, symbols, and terms are used throughout the following description and claims, and include:

As used herein, the indefinite article "a" or "an" means one or more.

As used herein, "about" or "around" or "approximately" in the text or in a claim means±10% of the value stated.

The term "ambient temperature" refers to an environment temperature approximately 18° C. to approximately 25° C.

As used herein, the abbreviation "RT" means room temperature or a temperature ranging from approximately 18° C. to approximately 25° C.

As used herein, the abbreviation "XRD" means X-Ray Diffraction and "PXRD" means Powder X-Ray Diffraction.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

As used herein, the abbreviation "NAND" refers to a "Negative AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Note that herein, the terms "phase" refers to a crystalline solid with a regular and repeating 3-dimensional arrangement of the atoms. The measured powder pattern has diffraction peak positions and intensities are the "fingerprint" of a particular solid crystalline phase.

The standard abbreviations of the elements from the periodic table of elements are used herein. It should be understood that elements may be referred to by these abbreviations (e.g., Mo refers to molybdenum, W refers to tungsten, Si refers to silicon, C refers to carbon, etc.).

The unique CAS registry numbers (i.e., "CAS") assigned by the Chemical Abstract Service are provided to identify the specific molecules disclosed.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

"Comprising" in a claim is an open transitional term which means the subsequently identified claim elements are a nonexclusive listing (i.e., anything else may be additionally included and remain within the scope of "comprising"). "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actors in the absence of express language in the claim to the contrary.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Although it is disclosed that $MoCl_5$ in vapor phase demonstrated a trigonal bipyramid structure (Ewens et al., Trans. Faraday Soc. 1938, 34, 1358.) discloses that $MoCl_5$ in the vapor phase demonstrated a trigonal bipyramid structure, Applicants have discovered that the sublimation rate from solid $MoCl_5$ subject to normal industrial vaporization conditions is unstable, leading to possible performance drift in processes that utilize $MoCl_5$ vapors. In other words, as a canister of $MoCl_5$ is depleted during a vapor deposition process, the deposition rate of the Mo-containing film is not stabilized.

Further analysis demonstrates that the change in performance is due to the change of the crystal phase compositions of $MoCl_5$. More particularly, the crystal phase of freshly sublimed $MoCl_5$ tends to comprise a mixture of Phase 1 and Phase 3. However, during the vapor deposition process, the canister of $MoCl_5$ is heated to a temperature ranging from approximately 70° C. to approximately 170° C., preferably 90° C. to 140° C., and the composition would gradually change to a mixture of Phase 1 and Phase 2, where Phase 2 ranges from approximately 40% to approximately 80%.

Figure 1:
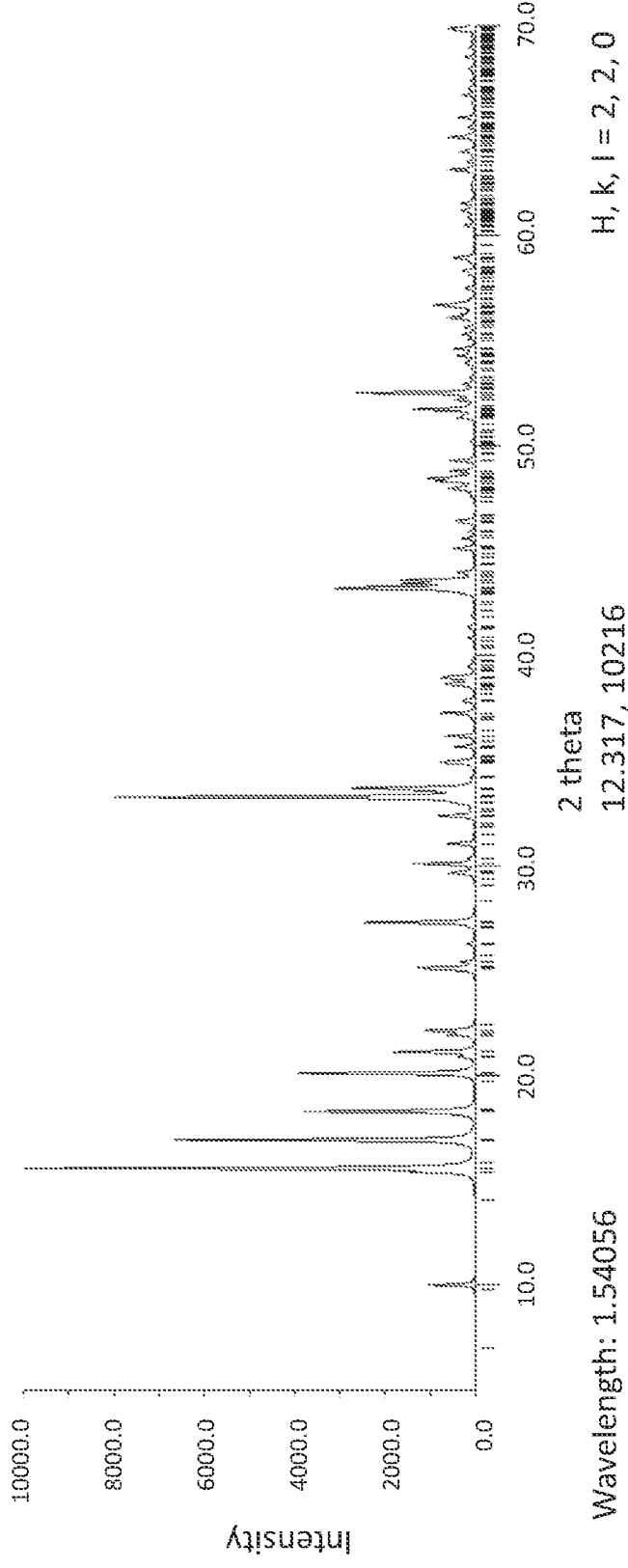
FIG. 1 is a simulated PXRD spectrum of $MoCl_5$ Phase 1 generated using Mercury software.

To our knowledge, the crystal structure of Phase 1 has not been reported. Phase 1 of $MoCl_5$ is monoclinic with space group 12 as C2/m. The unit cell parameters are a=18.01 Å, b=17.66 Å, c=5.76 Å, and β=90.18°. Phase 1 of $MoCl_5$ is isostructural to reported compounds $NbCl_5$ (PXRD pattern: ICDD PDF Card #04-0005-4229, see Zalkin et al., ("The crystal structure of $NbCl_5$", Acta Crystallogr. 1958, 11, 615-619)), $TaCl_5$ (PXRD pattern: ICDD PDF Card #04-109-4194, see Wimmer et al., ("$Li_2Ba_4Al_2Ta_2N_8O$, the First Barium Nitridoalumotantalate with BCT-Zeolite Type Structure", Anorg Allg Chem., 2001, 627, 180-185)), and $WCl_5$ (see U.S. Ser. No. 10/710,896B2). The crystal structure for Phase 1 may be generated by modifying the unit cell parameters of $NbCl_5$, $TaCl_5$, or $WCl_5$ with the above unit cell parameters collected from PXRD data. The corresponding Nb, Ta, or W atom is then replaced with Mo. The resulting powder XRD data is simulated using software such as Mercury or CrystDiffract software. FIG. 1 is a simulated PXRD spectrum of $MoCl_5$ Phase 1 generated using Mercury software.

The crystal structure of Phase 2 of $MoCl_5$ ($\alpha$-$MoCl_5$) has been disclosed in Acta Crystallogr., 1959, 12, 273 (ICDD PDF Card #04-007-5325) and Acta Crystallogr., 1967, 34, 770. Similar to Phase 1, Phase 2 is monoclinic with space group 12 as C2/m. The unit cell parameters are a=17.31(1) Å, b=17.81(1) Å, c=6.079(5) Å, β=95.7(1)°.

The crystal structure of Phase 3 of $MoCl_5$ ($\beta$-$MoCl_5$) has been disclosed in Acta Crystallogr., Sect. B: Struct. Sci. 1997, 53, 895-903 (ICDD PDF Card #04-013-3430). Different from Phase 1 and Phase 2, Phase 3 is triclinic with space group 2 as P-1. The unit cell parameters are a=6.594 (6) Å, b=9.048(9) Å, c=6.074(4) Å, α=90.81(4°), β=116.12 (5)°, γ=108.42(4)°.

TABLE 1

X-Ray Diffraction Simulation Data for $MoCl_5$ Phase 1, 2, and 3

| 2 Theta (°) | Phase 1 (rel. int. %) | 2 Theta (°) | Phase 2 (rel. int. %) | 2 Theta (°) | Phase 3 (rel. int. %) |
|---|---|---|---|---|---|
| 10.033 | 10.37 | 9.925 | 16.7 | | |
| | | 14.632 | 8.7 | 10.468 | 17.0 |
| 15.587 | 100.00 | 15.827 | 74.3 | 15.687 | 100.0 |
| | | 16.207 | 100.0 | 16.511 | 47.3 |
| 16.936 | 66.18 | 16.751 | 14.5 | 16.776 | 48.1 |
| | | 17.041 | 10.9 | 17.908 | 55.9 |
| 18.283 | 37.74 | 18.73 | 39.4 | 18.263 | 38.8 |
| 20.113 | 39.18 | 19.925 | 32.0 | | |
| 21.14 | 18.29 | 21.226 | 15.9 | 21.024 | 34.0 |
| | | 21.513 | 15.2 | 21.141 | 19.6 |
| 21.975 | 5.69 | | | 21.256 | 14.1 |
| 22.20 | 11.09 | | | 22.144 | 33.8 |
| | | 24.13 | 16.9 | | |
| 25.185 | 13.25 | | | | |
| 27.304 | 25.13 | 27.478 | 20.5 | | |
| 29.711 | 6.77 | 29.486 | 18.1 | 29.405 | 11.7 |
| 30.096 | 13.61 | | | 29.988 | 15.2 |
| 31.059 | 6.05 | | | | |
| 32.375 | 8.21 | | | | |
| 33.274 | 79.86 | | | | |
| 33.692 | 26.93 | | | | |

There are at least two more disclosed crystalline phases of $MoCl_5$ ($\gamma$-$MoCl_5$ and $\delta$-$MoCl_5$), but not present in detectable concentration in the materials we handled. $\gamma$-$MOCl_5$ (ICDD PDF Card #04-007-2432, Acta Crystallogr., Sect. B: Struct. Sci. 1997, 53, 895-903) is orthorhombic with space group 62 as Pnma. The unit cell parameters are a=11.700(9) Å, b=17.874(10) Å, c=6.085(3) Å. $\delta$-$MoCl_5$ (ICDD PDF Card #04-013-3431, Acta Crystallogr., Sect. B: Struct. Sci. 1997, 53, 895-903) is monoclinic with space group 14 as P21/a. The unit cell parameters are a=12.162 Å, b=11.750 Å, c=9.468 Å, β=108.88°.

All crystalline phases contain $MoCl_5$ dimer (i.e., $Mo_2Cl_{10}$). Each Mo atom is in a pseudo-octahedral geometry connected to four non-shared Cl atoms and two shared Cl atoms. As a result, the phase conversion from Phase 1 to Phase 2 is a diffusionless transformation. In other words, no major reorganization of the crystal structure is observed. In diffusionless transformations, the atoms change their positions slightly in a relatively coordinated manner without interruption of the original bonding (see, e.g., D. A. Porter et al., Phase transformations in metals and alloys, Chapman & Hall, 1992, p. 172).

As shown in the examples that follow, different methods were used to prepare $MoCl_5$ containing different percentages of Phase 1 and Phase 2, Phase 1 and Phase 3, or Phase 1, 2, and 3 materials. PXRD measurements were performed on a Bruker D8-Advance diffractometer (Cu Kα radiation, A=1.5418 Å). Leak tight low background dome sample holders are used. Samples are prepared and sealed in a nitrogen filled glovebox so that the air-sensitive materials were handled without air/moisture exposure.

Inside a nitrogen filled glovebox, materials is grounded into fine powders with an agate mortar and pestle. The powder had an average particle size ranging from approximately 20 um to approximately 200 um. X-ray output is 1600-2000 W, and the detector is Lynxeye XE-T energy dispersive compound silicon stripe detector. The powder patterns were collected using a θ-θ scan mode (range 2θ=8°-70°, step size of 0.01°).

The Rietveld method and reference crystal structures of FIG. 1 and Table 1 were used to determine the percentage of each crystal phase in a variety of $MoCl_5$ samples. More particularly, the background was determined and removed from each data set. The remaining diffraction peaks were matched to the reference patterns of FIG. 1 and Table 1 to determine the phase composition percentage.

To be specific, for $MoCl_5$ samples Which are normally mixtures of two phases (phase 1 and Phase 2, or Phase 1 and Phase 3), diffraction peaks in the data were matched to reference patterns for Phases 1, 2, and 3 listed in Table. The XRD data were then used to refine the relative phase fractions of the two crystalline phases in each sample. The final fits of the calculated diffraction intensities from the refined sample model to the raw XRD data was performed. The fits are usually good and refined phase fractions can be obtained. Bruker Topas v6.0 and MDI-Jade2010 were used.

Figure 2:
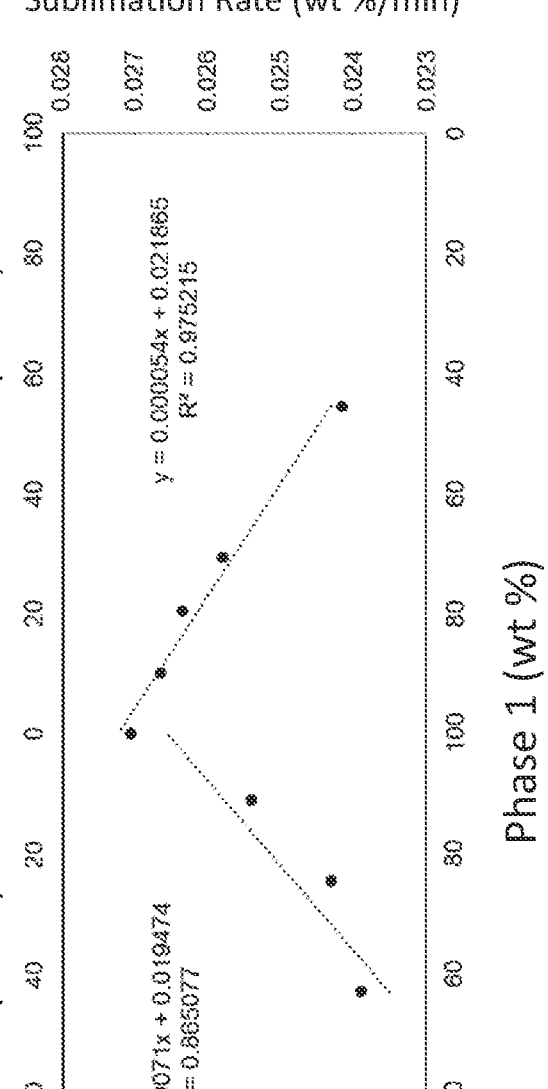
FIG. 2 is a diagram of materials sublimation rate vs. crystalline phase compositions $MoCl_5$.

Applicants have discovered that the Phase 1, Phase 2, and Phase 3 crystalline phases of $MoCl_5$ have different vapor pressures. FIG. 2 is a diagram of materials sublimation rate vs. crystalline phase compositions of $MoCl_5$. As shown in FIG. 2, samples containing higher concentrations of Phase 1 have a higher sublimation rate in comparison to samples containing lower concentrations of Phase 1. Therefore, Phase 1 has a higher vapor pressure than Phase 2 and Phase 3. As shown, supplying $MoCl_5$ that contains a mixture of Phase 1 and Phase 3, or Phase 1 and Phase 2 crystalline material will cause a vapor pressure variation over time because Phase 1 depletes faster than Phase 2 and Phase 3 (i.e., Phase 1 has a higher vapor pressure), even in the absence of any phase conversion. At 100° C. 100 sccm $N_2$ carrier gas isotherm measurement conditions, sublimation rate of Phase 1 ~0.02692 wt %/min, sublimation rate of Phase 2 is ~0.02187 wt %/min, and sublimation rate of Phase 3 is 0.01947 wt %/min. Phase 1 is ~23% more volatile than Phase 2, and Phase 1 is ~38% more volatile than Phase 3.

Additionally, as shown in Example 4, Phase 3 converts to Phase 1, and then converts partially to Phase 2 during the vapor deposition processes. This conversion further exacerbates the vapor pressure drift.

The accompanying change in the overall volatility due to the difference in vapor pressures and the conversion of Phase 3 to Phase 1, and then Phase 1 material to Phase 2 results in potentially unstable on tool performance, and may shorten the use of the $MoCl_5$ materials and the necessity to adjust equipment parameters in order to be able to maintain a sufficient and stable supply of $MoCl_5$ vapors to the vapor deposition tool.

Ideally, it is preferable that we offer a product composed of a single phase. However, due to the nature of ongoing phase conversion at elevated usage condition, even starting from a single-phase materials, upon subliming the materials under heat, phase composition will change inevitably. To be more specific, Phase 3 to Phase 1 conversion occurs at lower temperature and faster rate than Phase 1 to Phase 2 conversion which occurs at a relatively higher temperature and slower rate. Phase 3 to Phase 1 conversion can be complete, however, Phase 1 to Phase 2 conversion is partial and will reach an equilibrium instead of a pure single-phase materials.

To this end, a constant and equilibrated Phase 1: Phase 2 ratio must be maintained in order to offer a stable vapor pressure over time. As shown in Example 3, Phase 1 and 3 mixture of $MoCl_5$ converts partially to Phase 1 and 2 mixture of $MoCl_5$ during the vapor deposition process. Applicants have discovered that the Phase 2-rich material does not convert back to Phase 1. As a result, Phase 2 $MoCl_5$ may be supplied at any temperatures.

$MoCl_5$ may be heated to a temperature just below its melting point in order to convert it from Phase 3 and Phase 1 mixture material to Phase 2 rich material (i.e., m.p.=194° C.). The phase conversion occurs faster at the higher temperatures.

The phase conversion that typically occurs during the vapor deposition process (i.e., at temperatures ranging from approximately 70° to approximately 120° C.) occurs much slower than the phase conversion that occurs between 140° C. at 180° C. During the vapor deposition process, the vapors of $MoCl_5$ are typically generated using a solid precursor vaporizer heated to a temperature ranging from approximately 70° C. to approximately 180° C. The solid precursor vaporizer is typically a stainless steel vessel, with at least an inlet and an outlet connected to isolation valves. Heating the solid precursor vaporizer to temperatures above 150° C. for extended period in order to convert the material from Phase 1 to Phase 2 may result in corrosion of the vaporizer, and contamination of the $MoCl_5$ by stainless steel elements, such as Cr, Fe, Ni, etc.

Performing the phase conversion in a separate vessel enables faster phase conversion than occurs during the vapor deposition process. The vessel is chosen to withstand the both the material and its properties when heated. The vessel is also chosen to limit the risk of imparting any impurities into the $MoCl_5$. Suitable vessels including glass vessels, quartz vessels, glass coated vessels, etc. After the $MoCl_5$ converted to Phase 2-rich material, it may be filled into a solid precursor vaporizer for use in the vapor deposition process, to enable stable vapor supply.

At a temperature ranging from approximately 140° C. to below the $MoCl_5$ melting point 194° C. Using this approach enables a higher temperature and hence faster treatment with a limited risk of contamination, provided that the surface exposed to the $MoCl_5$ is not metallic. As such, Example 4 also indicates that $MoCl_5$ is stable in this temperature region, as exemplified by the low amount of non-volatile residue observed by TGA after the treatment.

Stainless steel may be treated to enhance corrosion resistance. Exemplary treatment includes electropolishing (EP), coating with metal oxide, $SiO_2$, laminates, platings, etc. However, the time required to reach>50% Phase 2 material from Phase 1-rich material takes more than three days at 140° C. or lower.

By supplying predominantly Phase 1, in which case the $MoCl_5$ has to be kept at a T (<100° C.) at which the Phase 1 to Phase 2 partial conversion is sufficiently limited (typically <10%) over the duration of the usage of the package on the equipment (between 2 weeks and 24 months).

EXAMPLES

The following non-limiting examples are provided to further illustrate embodiments of the invention. However, the examples are not intended to be all inclusive and are not intended to limit the scope of the inventions described herein.

Example 1: Vacuum Sublimation

Equipment: Glass sublimator set and a chiller.

Crude $MoCl_5$ was added to the bottom of the glass sublimator set. The sublimator was then placed into a heating mantle and properly assembled. The sublimator set was pulling vacuum to a range of 1 mTorr to 10 Torr. The chiller was maintained with a coolant at temperature ranging from 0 to 30° C. The heating mantle temperature was maintained ranging from 140 to 180° C. After heating, the heating mantle was turned off and allowed to cool. The sublimator set was then backfilled with inert gas, carefully disassembled and solid materials from the sublimator were then collected. Solid material samples (batch 1 to 5 below) were submitted for XRD analysis to quantify crystalline phases. The XRD analysis results are shown in Table 2.

TABLE 2

| Batch | Phase 1 (%) | Phase 3 (%) |
|---|---|---|
| Batch 1 | 35 | 65 |
| Batch 2 | 27 | 73 |
| Batch 3 | 59 | 41 |
| Batch 4 | 44 | 56 |
| Batch 5 | 31 | 69 |

Example 2: Carrier Gas Assisted Sublimation

Equipment: Coated stainless steel sublimator set.

Crude $MoCl_5$ was loaded to the bottom of the coated stainless steel sublimator. Top lid was put on the sublimator and then the sublimator and the lid were secured together with clamp. Placed a heating mantle (lid) to cover the top lid. Connect one KF 40 joint of a stainless steel tubing to the lid of the sublimator with a KF 40 Kalrez gasket and secure it with clamp. Connect the other KF 40 joint of the stainless steel tubing to a receiving pot lid inlet. Connect a vacuum line to the receiving pot lid outlet. Connect $N_2$ carrier gas line to a sublimator purging port.

After system leak test, turn on temperature controllers with the following set up:

Sublimator bottom: 190+/−20° C.

Lid: 2000+/−20° C.

Transfer tubing: 220+/−20° C.

Recing pot lid: 225+/−20° C.

Set $N_2$ purging flow meter to a range of 10-500 atm cm³/min (sccm). After heating, turn off heating mantels and cool the sublimator below 60° C., and then turn off carrier gas $N_2$. The receiving pot was carefully disassembled, and solid materials were then collected. Solid material samples were submitted for XRD analysis to quantify crystalline phases. The XRD analysis results are shown in Table 3.

TABLE 3

| Batch | Phase 1 (%) | Phase 3 (%) |
| --- | --- | --- |
| Batch 1 | 66 | 34 |
| Batch 2 | 79 | 21 |
| Batch 3 | 84 | 16 |

Example 3: In-Situ Phase Change

Freshly vacuum sublimed (electronics grade quality) $MoCl_5$ made by the method described in Example 1 was added to a sublimator or a solid precursor vaporizer, and maintained at a temperature ranging from approximately 70° C. and 120° C. Overtime, all Phase 3 disappeared, and a mixture of Phase 1 and Phase 2 were formed. After more than 50% of the $MoCl_5$ material in a canister has been consumed during a vapor deposition process for a period of 2-24 months, Phase 2 concentration increased to 30% or more. It is believed that under standard sublimation and on standard usage conditions, it may take more than 2 months to produce the materials which majority is Phase 2 $MoCl_5$. The results are listed in Table 4.

TABLE 4

| Batch | Initial Weight (g) | Final Weight (g) | % (w/w) Consumed | % Phase 1 Remaining | % Phase 2 Remaining |
| --- | --- | --- | --- | --- | --- |
| 1 | 502 | 135 | 73 | 43 | 57 |
| 2 | 500 | 246 | 51 | 49 | 51 |

Example 4: Conditioning at Small Scale (<20 g)

In a glovebox, 10-20 grams of freshly sublimed $MoCl_5$ solids made by the method described in Example 1 were added to 316L stainless steel tubings. The tubings were sealed inside a nitrogen filled glovebox. The stainless steel tubings with $MoCl_5$ were than heated by either submerging in heat bathes or ovens at a temperature ranging from 70° C. to 190° C. for a period of time. The stainless steel tubings were then removed from the heat bathes or ovens and allowed to cool down in 1 hr, and then brought back to the glovebox. A shiny cake was observed in the stainless steel tubings, which could be broken into shining crystallines. The shiny cake product was collected and submitted for XRD analysis to quantify crystalline phases. The results are listed in Tables 5A to 50.

TABLE 5A

| Batch 1 | Phase 1 (%) | Phase 3 (%) | Temp. (° C.) | Time (hr) | Phase 1 (%) | Phase 2 (%) | Phase 3 (%) |
| --- | --- | --- | --- | --- | --- | --- | --- |
| Run 1 | 59 | 41 | 100 | 24 | 81 | 0 | 19 |
| Run 2 | | | 120 | | 92 | 0 | 8 |
| Run 3 | | | 140 | | 100 | 0 | 0 |
| Run 4 | | | 160 | | 49 | 54 | 0 |

TABLE 5B

| Batch 1 | Phase 1 (%) | Phase 3 (%) | Temp. (° C.) | Time (week) | Phase 1 (%) | Phase 2 (%) | Phase 3 (%) |
| --- | --- | --- | --- | --- | --- | --- | --- |
| Run 1 | 59 | 41 | 100 | 1 | 70 | 0 | 30 |
| Run 2 | | | | 2 | 73 | 0 | 27 |
| Run 3 | | | | 4 | 89 | 0 | 11 |

TABLE 5C

| Batch 1 | Phase 1 (%) | Phase 3 (%) | Temp. (° C.) | Time (week) | Phase 1 (%) | Phase 2 (%) | Phase 3 (%) |
| --- | --- | --- | --- | --- | --- | --- | --- |
| Run 1 | 59 | 41 | 120 | 1 | 80 | 20 | 0 |
| Run 2 | | | | 2 | 78 | 22 | 0 |
| Run 3 | | | | 4 | 71 | 29 | 0 |

TABLE 5D

| Sample | Phase 1 (%) | Phase 3 (%) | Temp. (° C.) | Time (hr) | Phase 1 (%) | Phase 2 (%) |
| --- | --- | --- | --- | --- | --- | --- |
| Batch 1 Run 1 | 35 | 65 | 170 | 6 | 23 | 77 |
| Batch 1 Run 2 | 35 | 65 | 170 | 6 | 17 | 83 |
| Batch 2 Run 1 | 27 | 73 | 170 | 6 | 25 | 75 |
| Batch 2 Run 2 | 27 | 73 | 170 | 6 | 28 | 72 |
| Batch 3 Run 1 | 59 | 41 | 170 | 6 | 18 | 82 |
| Batch 3 Run 2 | 59 | 41 | 170 | 6 | 26 | 74 |

Example 5: Large Scale Conditioning (~500 g)

Figure 3:
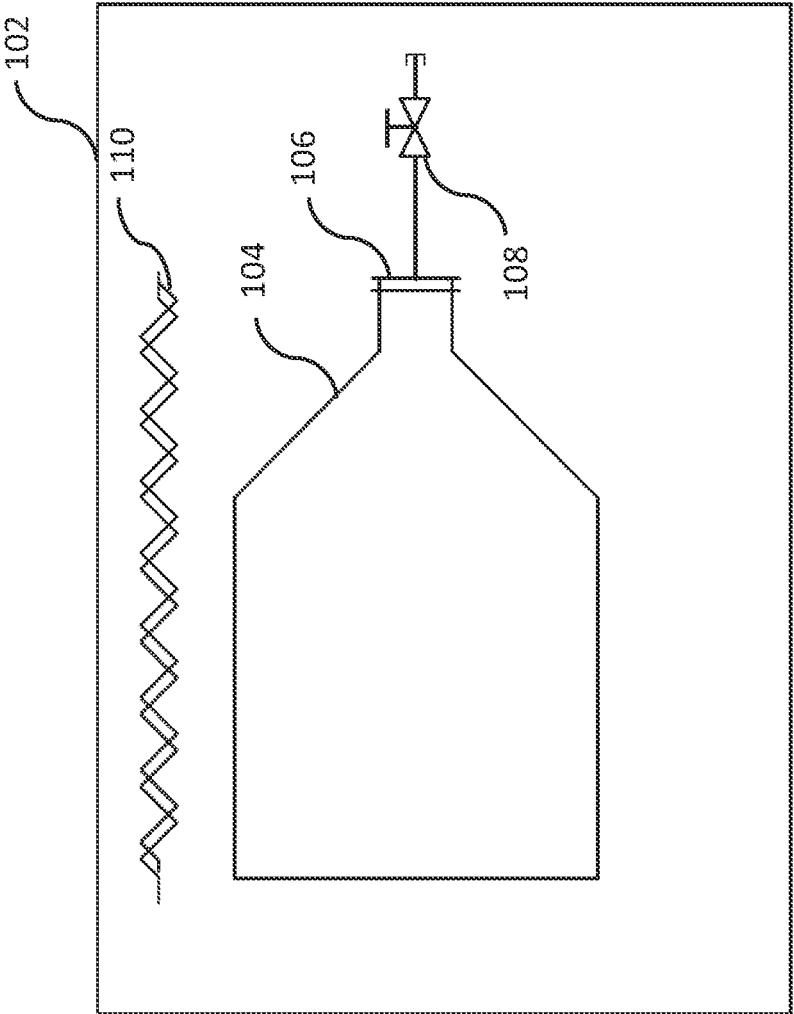
FIG. 3 is a schematic diagram of the exemplary equipment in which this example was performed.

FIG. 3 is a schematic diagram of the exemplary equipment in which this example was performed. As shown, jar 104 was placed in oven 102. Valve 108 was fluidly connected to lid 106 of jar 104. Jar 104 may be a coated stainless steel jar. Valve 108 may be used for introducing vacuum, positive pressure, and leak check the sealing. Numeral 110 shows a heating element in oven 102. One of ordinary skill in the art will further recognize the sources for the equipment. Some level of customization of the components may be required based upon the desired temperature range, pressure range, local regulations, etc.

In a glovebox (not shown), 500 g (+/−50 g) grams of freshly sublimed $MoCl_5$ made by the method described in Example 1 or Example 2 was added to jar 104. Here jar 104 may be an 8 L coated stainless steel jar. Jar 104 was then leak checked by vacuum spiking and He outboard methods. Afterwards, jar 104 was heated at 170° C. for 24-48 hours using oven 102. After the time requirement was met, heating of oven 102 was turned off. Jar 104 was allowed to slowly cool to below 60° C. inside oven 102. Jar 104 was then removed from oven 102 and transferred back into the glovebox. Lid 106 of jar 104 was disassembled and a big shiny black cake on the bottom of jar 104 was formed in jar 104 that was poured into a glass mortar. Crystalline powders were obtained by roughly grinding the big shiny black cake with the glass mortar and a pestle. A product of crystalline powders was collected and submitted for XRD analysis to quantify crystalline phases. Table 6 demonstrates that this process repeatedly yields product having approximately 50-60% weight of Phase 2 material.

TABLE 6

| Sample | Phase 1 (%) | Phase 3 (%) | Temp. (° C.) | Time (hr) | Phase 1 (%) | Phase 2 (%) |
|---|---|---|---|---|---|---|
| Batch 1 | 32 | 68 | 170 | 24 | 48 | 52 |
| Batch 2 | 30 | 70 | 170 | 36 | 45 | 55 |
| Batch 3 | 45 | 55 | 170 | 48 | 46 | 54 |
| Batch 4 | 59 | 41 | 170 | 24 | 45 | 55 |
| Batch 5 | 50 | 50 | 170 | 36 | 42 | 58 |
| Batch 6 | 56 | 44 | 170 | 48 | 42 | 58 |

These $MoCl_5$ materials are thermally stable and would be suitable to provide a stable vapor supply of $MoCl_5$ vapor during a vapor deposition or etching processes.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method of conditioning $MoCl_5$, the method comprising heating a container of a mixture of Phase 1 and Phase 3 $MoCl_5$ that contains approximately 10% weight to approximately 90% weight of Phase 3 $MoCl_5$ to a temperature ranging from approximately 140° C. to 190° C. for a period ranging from approximately 2 hours to approximately 100 hours to produce a $MoCl_5$-containing composition comprising approximately 10% weight to approximately 60% weight of Phase 1 $MoCl_5$ and 90% weight to approximately 40% weight of Phase 2 $MoCl_5$, as determined by X-ray diffraction, wherein the Phase 3 $MoCl_5$ is transferred to the Phase 1 and Phase 2 $MoCl_5$.

2. The method of claim 1, wherein the container is selected to be non-reactive to $MoCl_5$.

3. The method of claim 1, wherein the container is glass or glass-lined.

4. The method of claim 1, wherein the container is stainless steel.

5. The method of claim 1, wherein the container is glass, Teflon, or coated stainless steel.

6. The method of claim 1, wherein the period ranges from approximately 24 hours to approximately 72 hours.

7. The method of claim 1, wherein the period ranges from approximately 36 hours to approximately 48 hours.

8. The method of claim 1, wherein the temperature ranges from approximately 150° C. to 180° C.

9. The method of claim 1, wherein the temperature ranges from approximately 160° C. to 170° C.

10. The method of claim 1, wherein the $MoCl_5$-containing composition comprises approximately 10% weight to approximately 60% weight of Phase 1 $MoCl_5$ and 90% weight to approximately 40% weight of Phase 2 $MoCl_5$.

11. The method of claim 1, wherein the $MoCl_5$-containing composition comprises approximately 20% weight to approximately 50% weight of Phase 1 $MoCl_5$ and 80% weight to approximately 50% weight of Phase 2 $MoCl_5$.

12. The method of claim 1, wherein the $MoCl_5$-containing composition comprises approximately 30% weight to approximately 55% weight of Phase 1 $MoCl_5$ and 70% weight to approximately 45% weight of Phase 2 $MoCl_5$.

13. The method of claim 1, wherein the $MoCl_5$-containing composition comprises approximately 40% weight to approximately 50% weight of Phase 1 $MoCl_5$ and 60% weight to approximately 50% weight of Phase 2 $MoCl_5$.

14. A $MoCl_5$-containing composition conditioned by the method of claim 1, having approximately 10% weight to approximately 60% weight of Phase 1 $MoCl_5$ and 90% weight to approximately 40% weight of Phase 2 $MoCl_5$.

15. The $MoCl_5$-containing composition of claim 14, having approximately 20% weight to approximately 50% weight of Phase 1 $MoCl_5$ and 80% weight to approximately 50% weight of Phase 2 $MoCl_5$.

16. The $MoCl_5$-containing composition of claim 14, having approximately 30% weight to approximately 55% weight of Phase 1 $MoCl_5$ and 70% weight to approximately 45% weight of Phase 2 $MoCl_5$.

17. The $MoCl_5$-containing composition of claim 14, having approximately 40% weight to approximately 50% weight of Phase 1 $MoCl_5$ and 60% weight to approximately 50% weight of Phase 2 $MoCl_5$.

18. The $MoCl_5$-containing composition of claim 14, being thermally stable and providing stable vapor supply.

\* \* \* \* \*